April 26, 1966 D. S. WEED 3,248,474

SUBSTRATE FOR INTEGRATED ELECTRICAL CONNECTIONS

Filed June 6, 1962

INVENTOR
DONALD S. WEED

BY George Baron
ATTORNEY

United States Patent Office 3,248,474
Patented Apr. 26, 1966

3,248,474
SUBSTRATE FOR INTEGRATED ELECTRICAL CONNECTIONS

Donald S. Weed, Hurley, N.Y., assignor to International Business Machines Corporation, New York, N.Y., a corporation of New York Filed June 6, 1962, Ser. No. 200,574
8 Claims. (Cl. 174—68.5)

This invention relates to the manufacture of integrated electrical connections.

The invention is particularly applicable to the making of inexpensive panels carrying electrical circuits, such circuits being particularly useful when appearing as basic card circuits. Such basic circuits may be employed in superconductive circuits operating near absolute zero or at room temperature.

The invention employs a substrate composition which allows electrical continuity to be readily established between points on the surface of such substrate. The substrate is fabricated from a mixture of epoxy resin and particles of a malleable metal in the following proportions: epoxy resin 10%-metallic particles 90%. The mixture is molded after mixing. When the molded mixture has set, electrical paths can be formed on the surface of this mixture by scribing a line with a sharp instrument from one point to another. It has been found that the scribing with a sharp instrument removes the insulation on the surface but smears the particles of metal imbedded in the epoxy resin into a continuous path. This continuous path is electrically conductive.

An object of this invention is to provide an economical method for manufacturing integrated electrical connectors.

It is another object to provide an article of manufacture permitting many complex circuits to be interconnected without the need for complicated plating or wiring techniques.

Yet another object is to manufacture standard size substrates for electrical circuitry that can be employed as electrical interconnections between other electrical circuits and/or components.

A further object is to make an electrical interconnecting substrate wherein the interconnections can be made exceedingly fine.

The foregoing and other objects, features and advantages of the invention will be apparent from the following more particular description of a preferred embodiment of the invention as illustrated in the accompanying drawing.

Wherein

Figure 1:
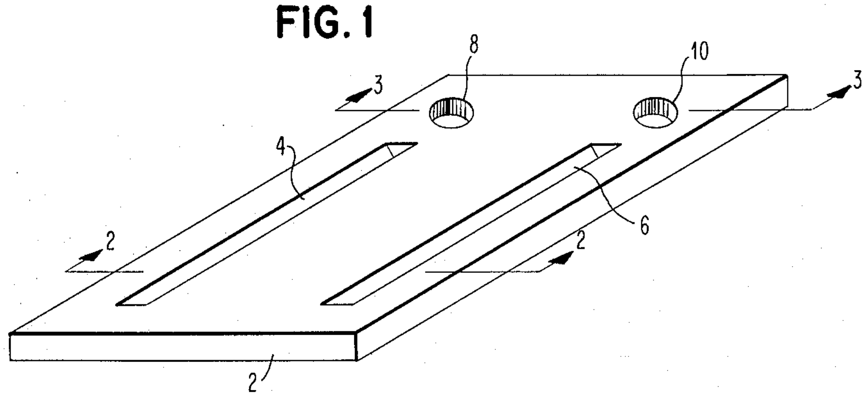
FIGURE 1 is a first embodiment of the invention.

In FIGURE 1 there is shown a substrate 2 which has been molded, stamped, or otherwise made into a uniform card or surface. Such substrate 2 consists of an intimate mixture of 10% spoxy resin and 90% metal, by weight, the metal being preferably soft, such as lead. Other conducting metals, such as copper, aluminum, etc. may be employed the softer metals being more desirable. It is understood that the ratio of metal to epoxy resin can be varied over a wide range. The size and shape of the metal particles can be varied to produce the optimum metal and epoxy combination, the present ratio being selected as being typical for one that can be employed either at the extreme low temperatures needed for superconductive circuitry or can be used at room temperature. Lines 4 and 6 appearing on the upper surface of substrate 2 have been made by employing a sharp instrument which has cut through the upper surface of the substrate and has penetrated into the interior of such substrate so as to smear the lead particles imbedded in the substrate into a continuous path. Holes 8 and 10 made in such substrate 2 have been punched or drilled so that the punching or drilling operation has smeared the lead to form a continuous surface of conductive material.

Figure 2:
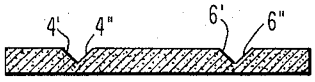
FIGURE 2 is a cross-section taken along the line 2—2 of FIGURE 1.

In FIGURE 2, the scribing instrument employed is such as a leave a V-shape notch within the upper surface of substrate 2. Thus, each surface of the V, such as 4′ or 4″, and 6′ or 6″ is conductive. The smearing operation has obtained a relatively wide conductive path for a relatively narrow cut into the composite block or substrate 2.

Figure 3:
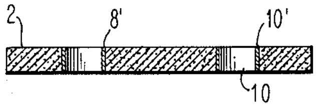
FIGURE 3 is a cross-section taken along the line 3—3 of FIGURE 1.

In FIGURE 3, holes 8 and 10, when the drilling or punching operation has terminated, leaves a cylindrical wall 8′ or 10′ of conducting surface. Such cylindrical wall 8′ or 10′ can be employed as an electrical connector between any circuits that have been scribed on the upper surface of block 2 with any circuits that have ben scribed on the lower surface of block 2.

Figure 4:
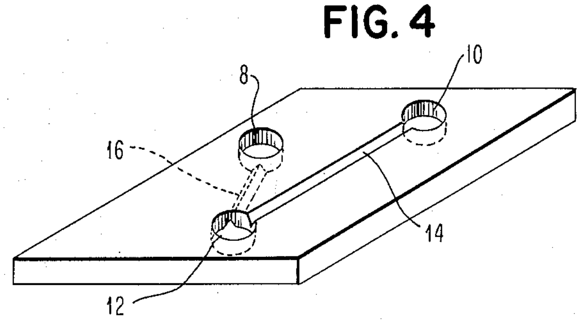
FIGURE 4 is another showing of the invention.

FIGURE 4 is a showing of how one may interconnect circuits appearing on the upper surface of block 2 with circuits appearing on the lower of block 2. Holes 8, 10 and 12 are made in the body of block 2 at preselected areas of such block. Line 14 is scribed onto the upper surface of block 2 so as to connect the conducting wall of hole 10 with the conducting wall of hole 12. In a similar manner, conductive path 16 is scribed in the lower surface of block 2 connecting the conductive wall of hole 12 with the conductive wall of hole 8. Consequently, a conductive path is seen to exist from hole 10 to hole 12 along line 14, and the conducting electrical circuit goes from hole 12 to hole 8 through scribed path 16. Thus, electrical paths have been created through punching operations or cutting operations, the latter two operations being exceedingly simple to perform, being merely mechanical operations as distinct from those methods requiring chemical, electroplating or vacuum deposition techniques.

Figure 5:
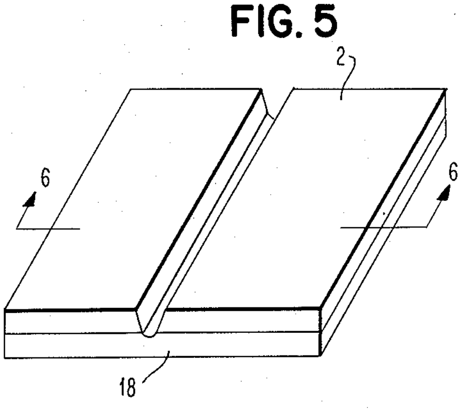
FIGURE 5 shows the invention employing a relatively broad electrical path.
Figure 6:
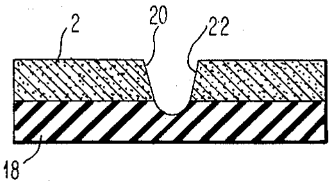
FIGURE 6 is a cross-section taken along the line 6—6 of FIGURE 5.

In FIGURE 5, the block 2 composed of the combination of epoxy resin and metallic particles is supported by an insulating sheet 18. Block 2 is scribed until the insulating portion 18 is reached by the scribing implement. When the scribing has been completed, one obtains the end result shown in FIGURE 6, wherein 20 and 22 are conducting surfaces. These conducting surfaces are insulated from each other and can be used as conductive transmission lines. Again, one is able to obtain relatively large conductive surfaces employing relatively small widths on the surface of block 2. The latter technique achieves relatively high density of packaging, such density being desired in the construction of electrical network circuits.

The substrate described and shown herein is exceedingly simple to manufacture, is highly reliable in operation, and can be employed at room temperatures or at temperatures near absolute zero in that the block 2 itself changes as a whole in response to changes in temperature. While epoxy resin has been chosen as an illustrative nonconducting carrier for the dispersed metal particles, other suitable plastics can be employed without departing from the spirit of the invention. Thus, the scribed circuits will not peel from or separate from its associated substrate. The scribed circuits are a part of the substrate. Thus, the present invention has certain desirable characteristics, such as being moisture resistant, having good thermal conductivity, long life, and being readily adaptable for connecting conventional circuits now employed in industry.

What is claimed is:

1. A method of manufacturing an integrated electrical network comprising the steps of mixing particles of a malleable metal into an insulative carrier in such relative proportions and particle size as to form a solid body of material comprising an electrically discontinuous dispersion of said metal in said carrier, and scribing a surface of said body so as to break through the insulation and smear said malleable metal particles into a continuous electrical path.

2. A method of manufacturing an integrated electrical network comprising the steps of mixing particles of a malleable metal into an insulative carrier in such relative proportions and particle size as to form a solid body of material comprising an electrically discontinuous homogeneous dispersion of said metal in said carrier, drilling holes through the body so as to break the insulation and smear said malleable metal particles into a continuous cylindrical electrical path from one surface of said body to another surface of said body, and scribing a surface of said body to create a continuous electrical path between the holes in said body.

3. A method of manufacturing an integrated electrical network comprising the steps of mixing particles of a malleable metal into an insulative carrier in such relative proportions and particle size as to form a solid body of material comprising an electrically discontinuous homogenous dispersion of said metal in said carrier, placing said body upon an insulating surface, and scribing said body until the latter is penetrated until the insulated member is reached, whereby the malleable metal is smeared to create two surfaces of electrically conducting paths.

4. An article of manufacture comprising an integrated electrical network having a body of material comprised of malleable metal particles dispersed in an insulative carrier generally in an electrically discontinuous manner, and electrical paths formed in a surface of said body by deformed structure of the metal particles at the surface of said body whereby some of said particles have been deformed into contact with each other into a continuous path.

5. An article of manufacture as defined in claim 4 wherein the malleable metal is lead.

6. An article of manufacture as defined in claim 4 wherein the insulative carrier is composed of an epoxy resin.

7. An article of manufacture as defined in claim 4 wherein the insulative carrier is an epoxy resin and the metallic particles are lead, and the proportions are 10% epoxy resin and 90% lead particles by weight.

8. A method of manufacturing an integrated electrical network comprising the steps of mixing particles of a malleable metal into an insulative carrier in such relative proportions and particle size as to form a solid body of material comprising an electrically discontinuous dispersion of said metal in said carrier, and mechanically deforming said body at a localized area so as to break through the insulation and simultaneously form said malleable metal particles into a continuous electrical path.

References Cited by the Examiner

UNITED STATES PATENTS

| | | | |
|---|---|---|---|
| 2,721,153 | 10/1955 | Hopf et al. | 29—155.5 |
| 3,002,457 | 10/1961 | Doughty | 29—155.57 |
| 3,044,151 | 7/1962 | Coler | 29—155.5 |

WHITMORE A. WILTZ, *Primary Examiner.*

JOHN F. CAMPBELL, *Examiner.*